United States Patent
Lei et al.

(10) Patent No.: US 10,711,370 B2
(45) Date of Patent: Jul. 14, 2020

(54) EPITAXIAL GROWING DEVICE AND METHOD FOR MAKING EPITAXIAL STRUCTURE USING THE SAME

(71) Applicants: Tsinghua University, Beijing (CN); HON HAI PRECISION INDUSTRY CO., LTD., New Taipei (TW)

(72) Inventors: Peng Lei, Beijing (CN); Peng Liu, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/954,717

(22) Filed: Apr. 17, 2018

(65) Prior Publication Data

US 2018/0334756 A1    Nov. 22, 2018

(30) Foreign Application Priority Data

May 22, 2017 (CN) .......................... 2017 1 0362271

(51) Int. Cl.
| | |
|---|---|
| *C30B 25/10* | (2006.01) |
| *C30B 25/18* | (2006.01) |
| *C30B 29/60* | (2006.01) |
| *C30B 29/02* | (2006.01) |
| *C30B 29/38* | (2006.01) |
| *C23C 16/50* | (2006.01) |
| *C30B 25/16* | (2006.01) |
| *C23C 16/26* | (2006.01) |
| *C23C 16/34* | (2006.01) |

(Continued)

(52) U.S. Cl.
CPC .............. *C30B 25/10* (2013.01); *C23C 16/26* (2013.01); *C23C 16/342* (2013.01); *C23C 16/458* (2013.01); *C23C 16/46* (2013.01); *C23C 16/50* (2013.01); *C30B 25/105* (2013.01); *C30B 25/16* (2013.01); *C30B 25/18* (2013.01); *C30B 29/02* (2013.01); *C30B 29/38* (2013.01); *C30B 29/602* (2013.01)

(58) Field of Classification Search
CPC combination set(s) only.
See application file for complete search history.

(56) References Cited

U.S. PATENT DOCUMENTS 4,698,256 A * 10/1987 Giglia .................. C08J 7/06
                                               427/404
6,420,092 B1 * 7/2002 Yang ...................... B82Y 10/00
                                               430/311

(Continued)

*Primary Examiner* — Erin F Bergner
(74) *Attorney, Agent, or Firm* — ScienBiziP, P.C.

(57) ABSTRACT

An epitaxial growing device to increase the speed of epitaxial deposition comprises a cavity comprising a reaction chamber, a gas supply unit, a vacuum pumping unit, a first electrode, a second electrode, and a carbon nanotube structure. A gas supply unit and the vacuum pumping unit are connected to the reaction chamber, the first electrode, the second electrode, and the carbon nanotube structure being located in the reaction chamber. The carbon nanotube structure is electrically connected to the first electrode and the second electrode and suspended through the first electrode and the second electrode and is heatable in itself. A method for growing an epitaxial layer using such device is also provided.

5 Claims, 15 Drawing Sheets

(51) Int. Cl.
  *C23C 16/46*    (2006.01)
  *C23C 16/458*   (2006.01)

(56) References Cited

U.S. PATENT DOCUMENTS

2008/0226838 A1* 9/2008 Nishimura .......... C23C 16/0272
                                                        427/569
2008/0251723 A1* 10/2008 Ward ........................ G01J 5/02
                                                        250/338.4
2014/0186256 A1* 7/2014 Wu ..................... C01B 31/0233
                                                        423/447.3

* cited by examiner providing an epitaxial growth device comprising: a cavity comprising a reaction chamber; a gas supply unit connected to the reaction chamber; a vacuum pumping unit connected to the reaction chamber; a first electrode located in the reaction chamber; a second electrode located in the reaction chamber; and a carbon nanotube structure located in the reaction chamber and electrically connected to the first electrode and the second electrode, wherein the carbon nanotube structure is suspended through the first electrode and the second electrode ⎯ step(S1)

opening the vacuum pumping unit to vacuum pumping the cavity ⎯ step(S2)

inputting an electrical signal to the carbon nanotube structure, to make a temperature of the carbon nanotube structure reach a set value ⎯ step(S3)

supplying a gas in the gas unit to the cavity, wherein an epitaxial layer is formed on a surface of the carbon nanotube structure ⎯ step(S4)

FIG. 3

EPITAXIAL GROWING DEVICE AND METHOD FOR MAKING EPITAXIAL STRUCTURE USING THE SAME

CROSS-REFERENCE TO RELATED APPLICATIONS

This application claims all benefits accruing under 35 U.S.C. § 119 from China Patent Application No. 201710362271.5, filed on May 22, 2017 in the China Intellectual Property Office, the contents of which are hereby incorporated by reference.

FIELD

The subject matter herein generally relates to an epitaxial growing device and a method for making an epitaxial structure.

BACKGROUND

Epitaxial growing method refers to a monocrystalline layer grown on a single crystal substrate, a crystal phase of the monocrystalline layer is the same as a crystal phase of the single crystal substrate. Epitaxial layering is a main material and process for fabricating semiconductor devices. Epitaxial layers such as boron nitride and graphite require very high temperature to grow.

Conventional epitaxial growing devices and methods for growing epitaxial layers need a furnace for heating. However, a heating rate of the furnace is low, there is a low deposition rate of the epitaxial layers. Raising a temperature to more than 2000° C. can take a long time, and energy consumption is relatively large.

BRIEF DESCRIPTION OF THE DRAWING

Implementations of the present technology will now be described, by way of example only, with reference to the attached figures, wherein:

FIG. 3 is a flow chart of one embodiment of a method for growing an epitaxial layer using the epitaxial growing device in FIG. 1.

DETAILED DESCRIPTION

Figure 1:
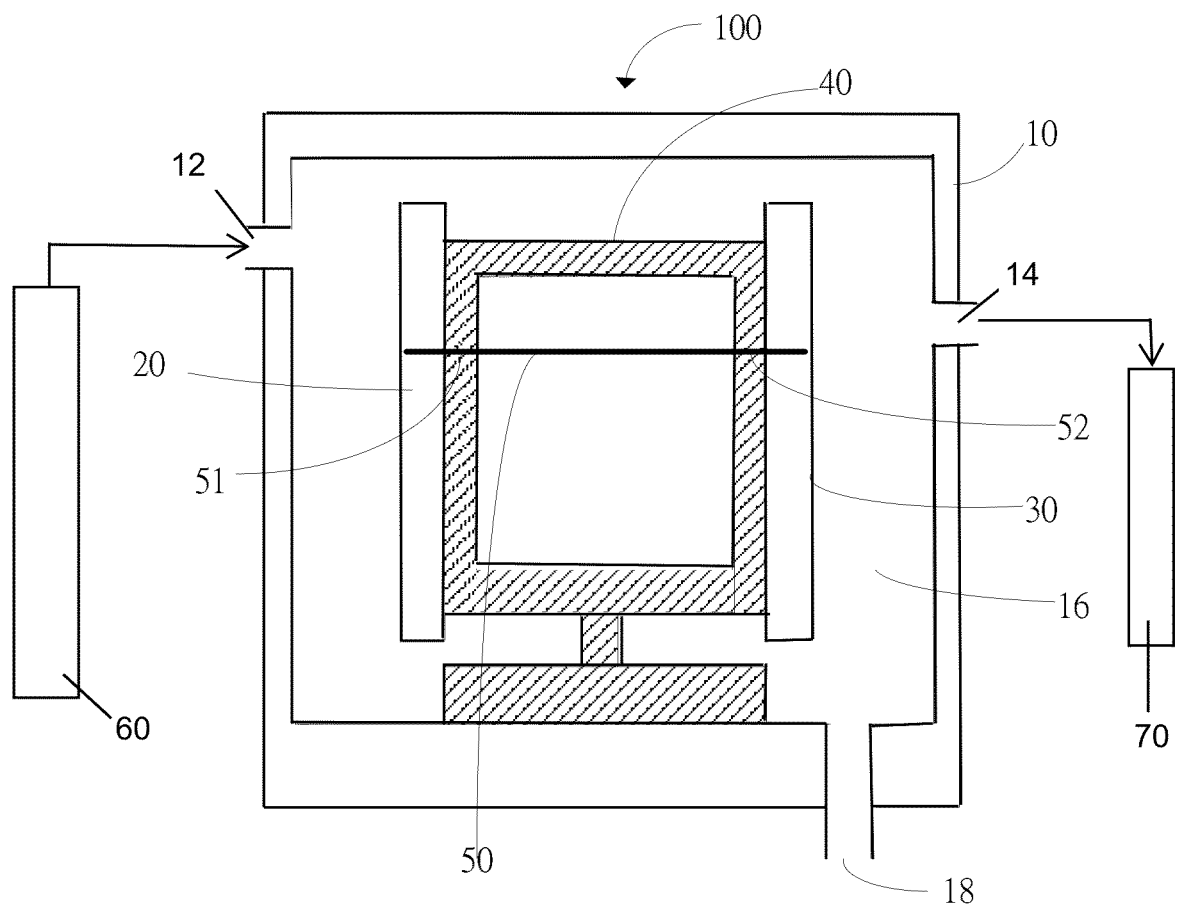
FIG. 1 is a structure schematic view of one embodiment of an epitaxial growing device.

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "substantially" is defined to be essentially conforming to the particular dimension, shape, or other feature which is described, such that the component need not be exactly or strictly conforming to such a feature. The term "comprise," when utilized, means "include, but not necessarily limited to"; it specifically indicates open-ended inclusion or membership in the so-described combination, group, series, and the like.

Referring to FIG. 1, the present disclosure is described in relation to an epitaxial growing device 100. The epitaxial growing device 100 comprises a cavity 10, a first electrode 20, a second electrode 30, a support 40, a carbon nanotube structure 50, a gas supply unit 60, a vacuum pumping unit 70, and a temperature controller (not shown).

The cavity 10 comprises an air inlet 12, an air outlet 14, and a reaction chamber 16. The first electrode 20, the second electrode 30, the support 40, and the carbon nanotube structure 50 are located in the reaction chamber 16. The support 40 is used for fixing the first electrode 20 and the second electrode 30. The support 40 can be optional in the epitaxial growing device 100. The first electrode 20 and the second electrode 30 are spaced apart from each other, and each of them is connected to an external power supply through a wire. The carbon nanotube structure 50 comprises a first end 51 and a second end 52. The first end 51 is located on the first electrode 20 and the second end 52 is located on the second electrode 30. The carbon nanotube structure 50 is suspended by means of the first electrode 20 and the second electrode 30. The carbon nanotube structure 50 is electrically connected to the first electrode 20 and the second electrode 30. In one embodiment, the cavity 10 further comprises a sample port 18, the sample port 18 is configured for taking out products.

The temperature controller can be a PID temperature controller, an infrared thermometer, or the like. In one embodiment, the temperature controller is the infrared thermometer. The cavity 10 can further comprise a visual window (not shown), and the infrared thermometer can sense a temperature of the carbon nanotube structure 50 through the visual window. The infrared thermometer is connected to the external power supply. The infrared thermometer can further comprise a temperature control unit; the temperature control unit can control the temperature of the carbon nanotube structure 50 by controlling a current of the external power supply.

The gas supply unit 60 is connected to the reaction chamber 16 and supplies gas for the reaction chamber 16. In one embodiment, the gas supply unit 60 is connected to the reaction chamber 16 through the air inlet 12 via a first hollow tube, and a gas of the gas supply unit is transported into the reaction chamber 16 through the first hollow tube. The nature of the gas in the gas supply unit 60 is determined according to a material of an epitaxial layer. In one embodiment, the epitaxial layer is a graphite layer, and the gas in the gas supply unit 60 can be carbon source gas or carbon source plasma. The carbon source gas comprises methane, ethane, acetylene, methane, or the like. The carbon source plasma can be methane plasma. In one embodiment, the epitaxial layer is boron nitride, and the gas in the gas supply unit 60 can be selected from borane, ammonia, borazine, or the like. In another embodiment, the gas in the gas supply unit 60 further comprises a protective gas, the protective gas is an inert gas.

In one embodiment, the gas supply unit 60 further comprises a gas flowmeter to regulate a gas flow.

In one embodiment, the vacuum pumping unit 70 is connected to the reaction chamber 16 through the air outlet 14 via a second hollow tube. The air in the reaction chamber 16 and the exhaust gas generated during a reaction process is discharged through the second hollow tube. A flow control valve is located between the second hollow tube and the vacuum pumping unit 70; the flow control valve is used to regulate a flow to prevent the carbon nanotube structure 50 from being damaged due to over-exhausting. In one embodiment, the vacuum pumping unit is a vacuum pump.

A material of each of the first electrode 20 and the second electrode 30 is a conductive but heat-resistant material, such as graphite and carbon nanotubes. In one embodiment, the first electrode 20 and the second electrode 30 are both graphite blocks.

The carbon nanotube structure 50 comprises a first end 51 and a second end 52. The first end 51 is located on the first electrode 20, and the second end 52 is located on the second electrode 30. The carbon nanotube structure 50 is suspended by the first electrode 20 and the second electrode 30. "Suspended" means that the first end 51 is located on the first electrode 20, the second end 52 is located on the second electrode 30, and the carbon nanotube structure 50 between them hangs in the air. The first end 51 can be wound around the first electrode 20, and the second end 52 can be wound around the second electrode 30. The first end 51 can also be fixed on the first electrode 20 using a first fixing tool, and the second end 52 can also be fixed on the second electrode 20 using a second fixing tool. In one embodiment, the first end 51 is fixed on the first electrode 20 using a first conductive but heat-resistant clip, and the second end 52 is fixed on the second electrode 30 using a second conductive but heat-resistant clip. In one embodiment, the first end 51 is fixed on the first electrode 20 using the first conductive but heat-resistant clip, and the second end 52 is fixed on the second electrode 30 using the second conductive but heat-resistant clip. A first carbon nanotube film is located between the first conductive but heat-resistant clip and the first electrode 20, and a second carbon nanotube film is located between the second conductive but heat-resistant clip and the second electrode 30. Resistance between the first electrode 20 and the carbon nanotube structure 50, and between the second electrode 30 and the carbon nanotube structure 50 is thus reduced.

The carbon nanotube structure 50 is a resistive element with a small heat capacity per unit area. In one embodiment, the heat capacity per unit area of the carbon nanotube structure 50 can be less than $2\times10^{-4}$ J/cm$^2$*K. In one embodiment, the heat capacity per unit area of the carbon nanotube layer structure is less than or equal to $1.7\times10-6$ J/cm$^2$*K. The carbon nanotube structure 50 comprises at least one carbon nanotube wire, at least one carbon nanotube film, and/or at least one carbon nanotube array.

The carbon nanotube wire can be carbon nanotube wire which is twisted or untwisted. When the carbon nanotube structure 50 comprises at least two carbon nanotube wires, the at least two carbon nanotube wires can be wound, stacked, or arranged side by side in co-planar manner. In one embodiment, the at least two carbon nanotube wires are co-planar and arranged side by side, and adjacent carbon nanotube wires are in contact with each other. In one embodiment, the at least two carbon nanotube wires are co-planar and arranged side by side, and the at least two carbon nanotube wires are separated from each other.

When the carbon nanotube structure 50 comprises at least two carbon nanotube films, the at least two carbon nanotube films are coplanar or stacked. The carbon nanotube film can be a drawn carbon nanotube film, a flocculated carbon nanotube film, or a pressed carbon nanotube film.

When the carbon nanotube structure 50 comprises at least two carbon nanotube arrays, the at least two carbon nanotube arrays can be arranged side by side or stacked with each other. The carbon nanotube array comprises a plurality of carbon nanotubes, such carbon nanotubes are interconnected by van der Waals force. The epitaxial layer can fill the carbon nanotube array.

Figure 2:
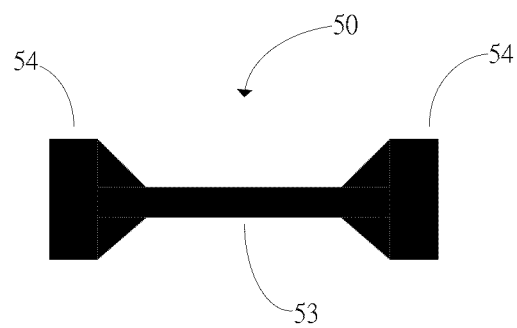
FIG. 2 is a structure schematic view of a carbon nanotube structure of the epitaxial growing device in FIG. 1.

Referring to FIG. 2, in one embodiment, the carbon nanotube structure 50 comprises a middle portion 53 and two end portions 54, a width of the middle portion 53 being less than that of the two second portions 54. A resistance of the middle portion 53 is large; when the external power supply is turned on, heat is generated in the carbon nanotube structure 50, and a heating rate is fast. The temperature of the carbon nanotube structure 50 heats up to more than 2000° C. in a few seconds. Moreover, since the resistance and current density of the middle portion 53 are large, the carbon nanotube structure 50 is high resistance even at high voltage and not easily burnt out. Since the temperature of the carbon nanotube structure reaches about 2000° C. in a few seconds, defects in the epitaxial layer can be repaired automatically, thus structural integrity of the epitaxial layer is excellent. The carbon nanotube structure in the epitaxial growing device are self-heating, there is no need to independently heat the epitaxial growing device, thus energy consumption is relatively low.

In one embodiment, the carbon nanotube structure 50 comprising the middle portion 53 and two end portions 54 is formed by a laser cutting method.

In one embodiment, the epitaxial growing device 100 further comprises a plasma device. The plasma device is located between the gas supply unit and the cavity 10. The plasma device renders the gas in the gas supply unit into plasma.

A working process of the epitaxial growing device 100 is as follows. After the external power supply is turned on, the first electrode 20, the second electrode 30, and the carbon nanotube structure 50 form a conductive path. Since the carbon nanotube structure 50 is a resistive element with a small heat capacity per unit area, an input electrical signal is quickly converted into thermal energy by the carbon nanotube structure 50, and a temperature of the carbon nanotube structure 50 increases rapidly. Gas from the gas supply unit then enters the cavity 10, and the epitaxial layer is formed on the surface of the carbon nanotube structure 50.

Referring to FIG. 3, a method for growing an epitaxial layer using the epitaxial growing device 100 is disclosed. The method comprises the following steps:
- step (S1): providing the epitaxial growing device 100;
- step (S2): opening the vacuum pumping unit to vacuum pumping the reaction chamber 16;
- step (S3): inputting an electrical signal to the carbon nanotube structure 50, to cause temperature of the carbon nanotube structure 50 to reach a set value; and
- step (S4): supplying a gas to the cavity 10 to form the epitaxial layer on a surface of the carbon nanotube structure 50.

In step (S2), in one embodiment, the epitaxial layer is a graphite layer, the gas is carbon source gas, and a pressure in the cavity ranges from about 0.1 Torr to about 1 Torr after vacuum pumping. In one embodiment, the epitaxial layer is a graphite layer, the gas is carbon source plasma, and a pressure in the cavity ranges from about 0.1 Torr to about 0.2 Torr after vacuum pumping.

In step (S3), the temperature of the carbon nanotube structure 50 can be set according to a material of the epitaxial layer. In one embodiment, the epitaxial layer is the graphite layer, the temperature of the carbon nanotube structure 50 is in a range from about 1800° C. to about 2600° C. after the external power supply is turned on, and such temperature is applied from about 10 minutes to about 3 hours.

In step (S4), the gas in the gas unit is selected according to the material of the epitaxial layer. In one embodiment, the epitaxial layer is a graphite layer, and the gas in the gas supply unit can be carbon source gas or carbon source plasma. The carbon source gas comprises methane, ethane, acetylene, methane, or the like. The carbon source plasma can be methane plasma. In one embodiment, the epitaxial layer is boron nitride, and the gas in the gas supply unit can be selected from borane, ammonia, borazine, or the like. In another embodiment, the gas in the gas supply unit further comprises an inert protective gas.

A gas flow into the cavity 10 ranges from about 10 sccm to about 30 sccm. When the gas flow is too small, such as smaller than 10 sccm, the gas in the cavity 10 will not be sufficient and an efficiency of generating the epitaxial layer will be low. When gas flow is too large, such as larger than 30 sccm, the gas will be excessive, impurities such as carbon deposition will be deposited on the surface of the carbon nanotube structure 50.

Example 1

Figure 4:
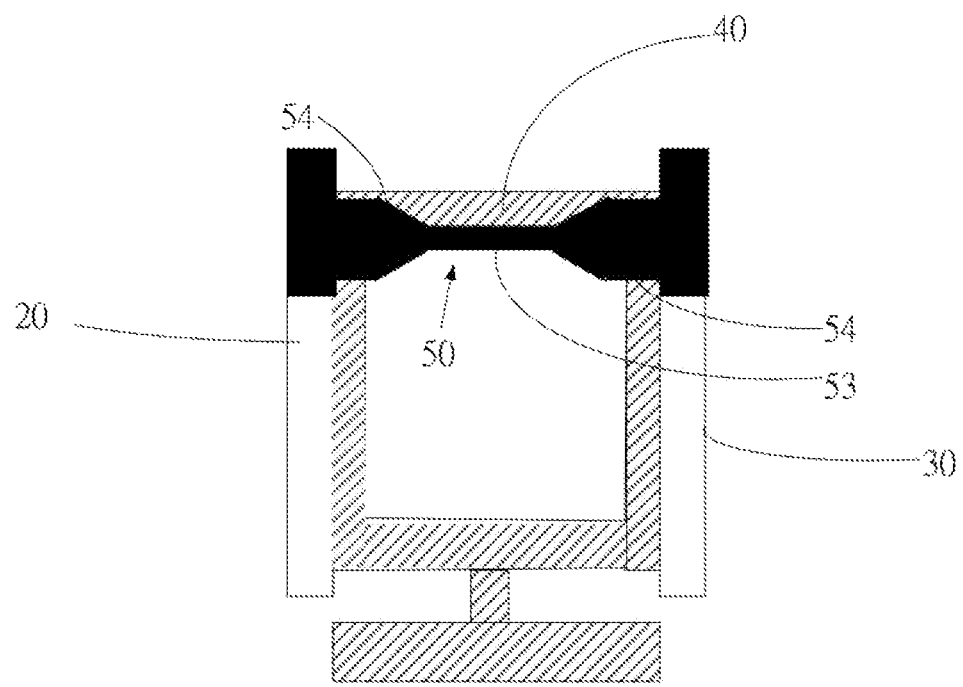
FIG. 4 is a photograph of an epitaxial growing device in Example 1.

Referring to FIG. 4, in the epitaxial growing device of this example, the carbon nanotube structure comprises 500 layers of carbon nanotube films stacked crosswise with each other. The carbon nanotube structure comprises the first portion with the first width and two second portions with the second width. A length of the first portion is about 7 mm, and the first width is about 3 mm. Opening the vacuum pumping unit to vacuum pumping the cavity 10 to make the pressure in the cavity reach about 0.133 Torr and inputting an electrical signal to the carbon nanotube structure to make the temperature of the carbon nanotube structure reach about 2500° C. Methane plasma is supplied to the cavity for about 30 minutes, a flow rate of methane plasma is about 20 sccm.

Figure 5:
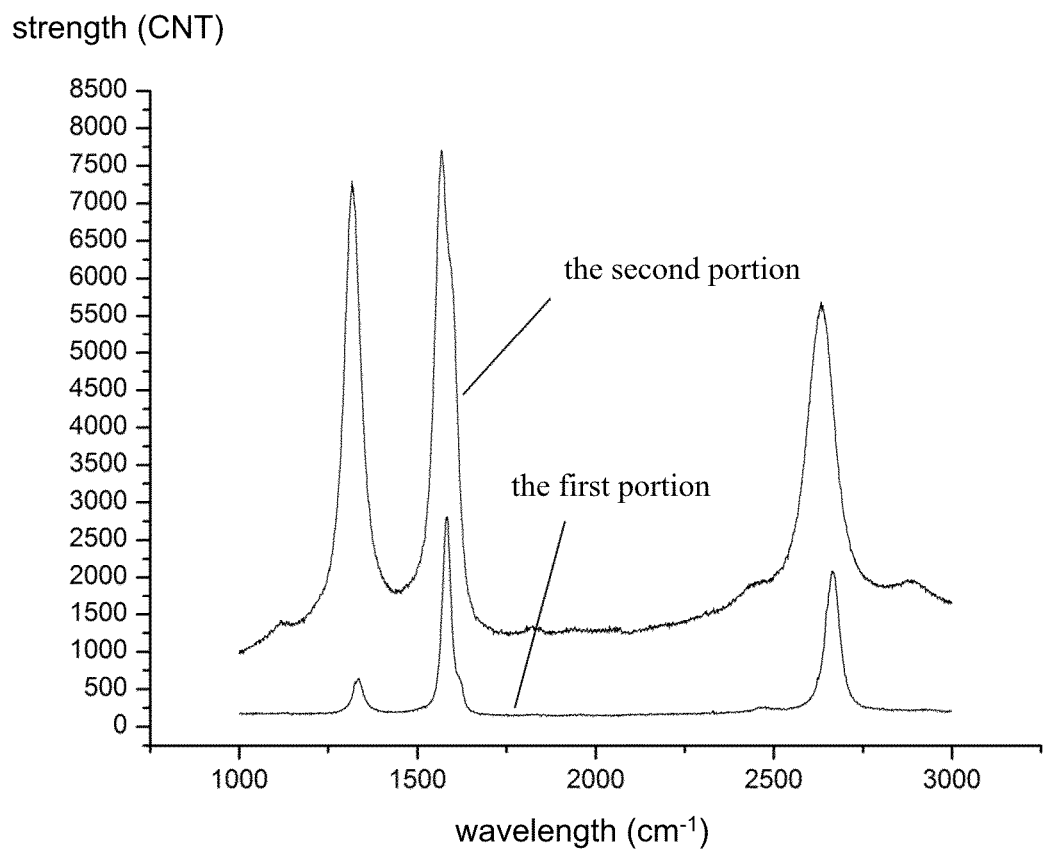
FIG. 5 is a Raman spectrum of a carbon nanotube structure after a deposition of a graphite layer in Example 1.

Referring to FIG. 5, a first Raman peak at 1340 cm$^{-1}$ of the first portion is much smaller than a second Raman peak at 1340 cm$^{-1}$ of the second portion, which shows that amorphous carbon on an outer surface of the first portion of the carbon nanotube structure is less. This further shows that an excellent graphitized carbon layer is formed on the outer surface of the first portion of the carbon nanotube structure.

Figure 6:
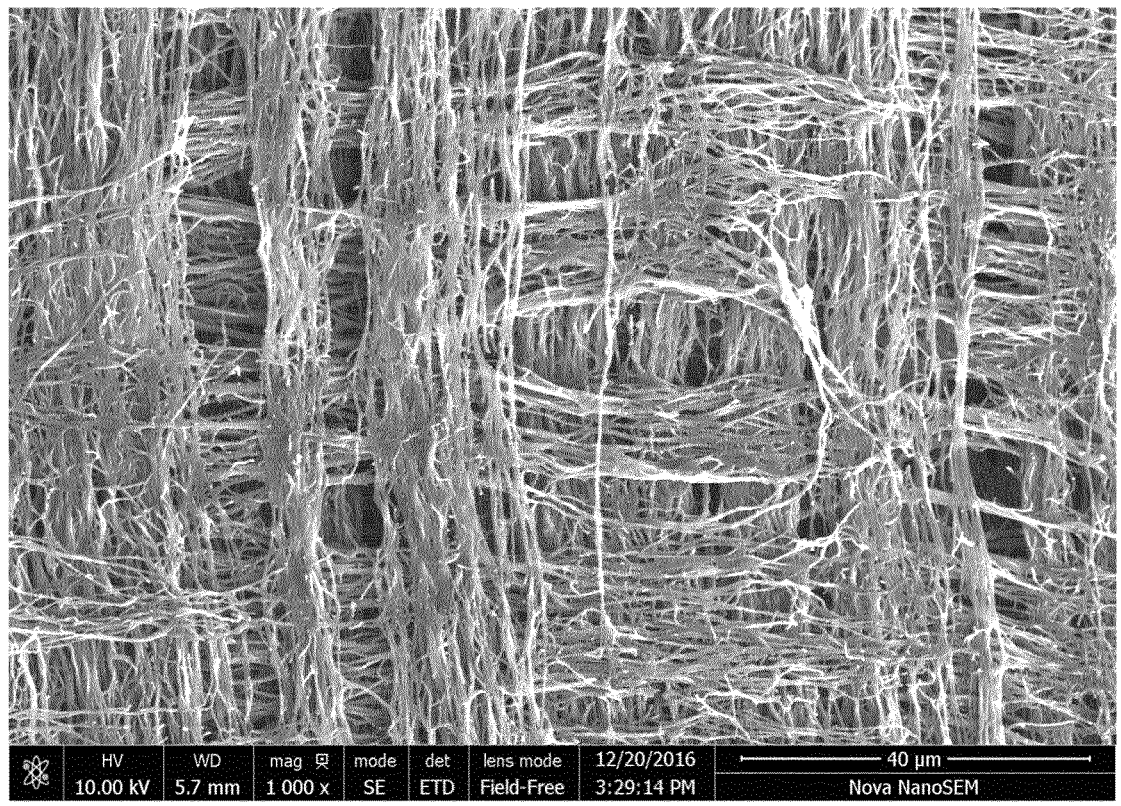
FIG. 6 is an electron microscope image of a first portion of the carbon nanotube structure after the deposition of the graphite layer in FIG. 5.
Figure 7:
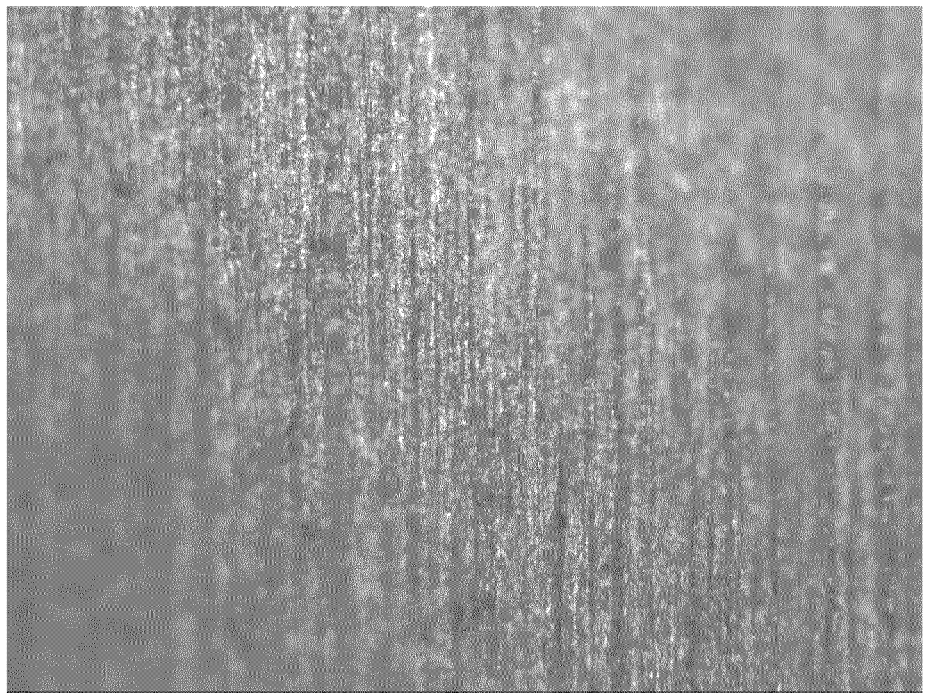
FIG. 7 is an optical microscope image of the first portion in FIG. 6.

FIG. 6 shows an electron microscope image of the first portion of the carbon nanotube structure in Example 1. FIG. 7 is an optical microscope image of the first portion of the carbon nanotube structure in Example 1. FIG. 6 and FIG. 7 show that a uniform epitaxial graphite layer is formed on the outer surface of the first portion of the carbon nanotube structure.

Figure 8:
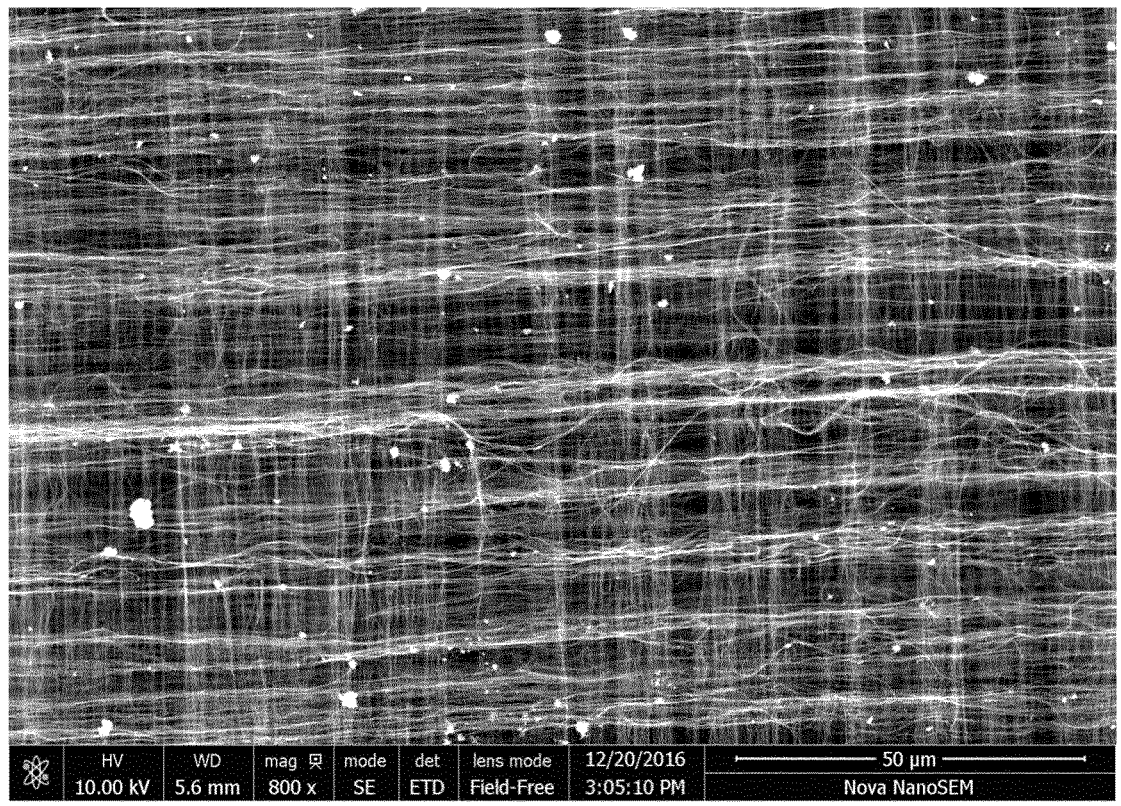
FIG. 8 is an electron microscope image of a second portion of the carbon nanotube structure after the deposition of the graphite layer in FIG. 5.
Figure 9:
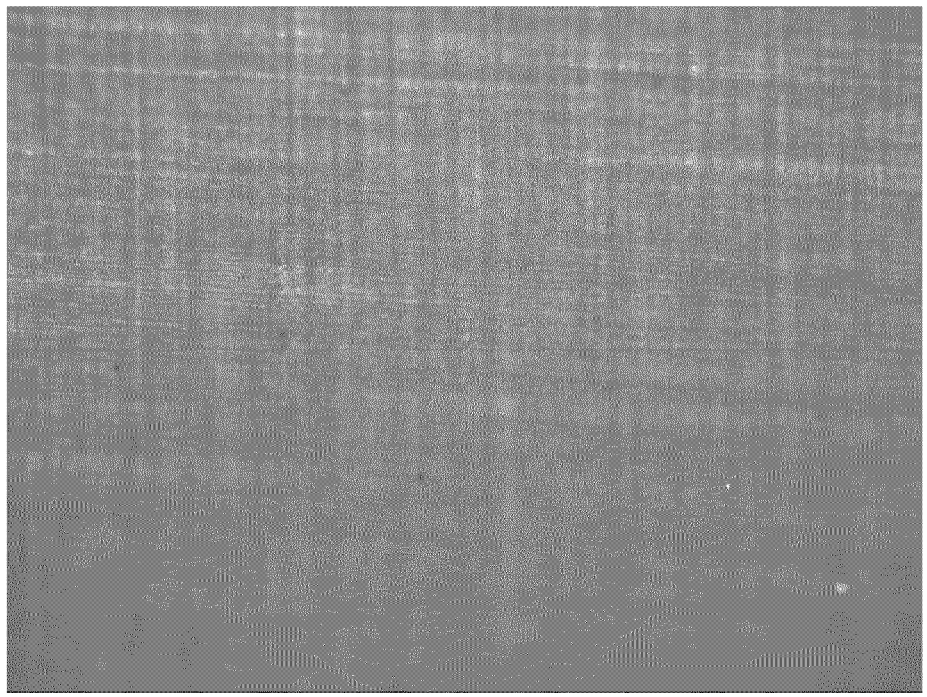
FIG. 9 is an optical microscope image of the second portion in FIG. 8.

FIG. 8 is an electron microscope image of the second portion of the carbon nanotube structure in Example 1. FIG. 9 is an optical microscope image of the second portion of the carbon nanotube structure in Example 1. FIG. 8 and FIG. 9 show few graphitized carbon layers formed on an outer surface of the second portion of the carbon nanotube structure, which shows that the deposited carbon at both ends of the carbon nanotube structure is not fully graphitized.

Figure 10:
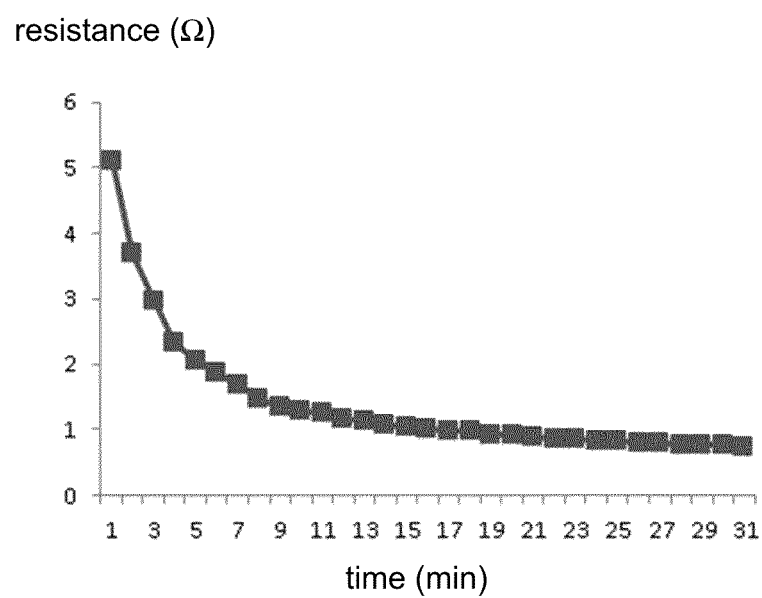
FIG. 10 is a resistance curve over time of the carbon nanotube structure during a deposition of a graphite layer in Example 1.

Referring to FIG. 10, the resistance of the carbon nanotube structure decreases as a heating time increases, which shows that a diameter of the carbon nanotube structure increases as the heating time increases. This also shows that a thickness of the graphite layer deposited on the surface of the carbon nanotube structure also increases as the heating time increases.

Example 2

Figure 11:
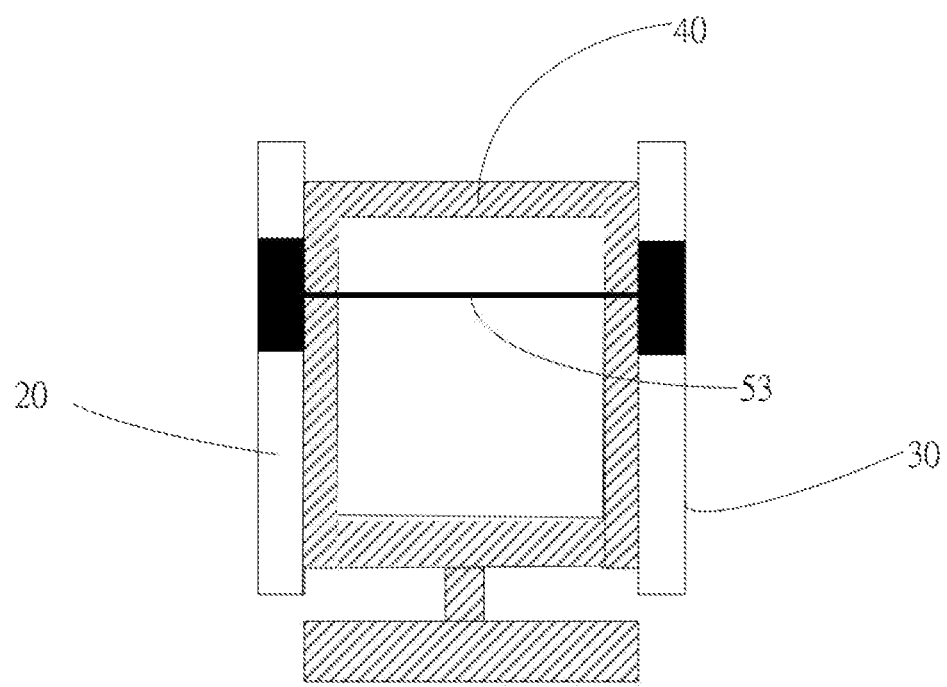
FIG. 11 is a photograph of an epitaxial growing device in Example 2.

Referring to FIG. 11, in the epitaxial growing device of this example, the carbon nanotube structure comprises five carbon nanotube wires overlapped with each other. A diameter of each of the five carbon nanotube wires is about 65 microns. Opening the vacuum pumping unit to make the pressure in the cavity 10 reach about 1.001 Torr and inputting an electrical signal to the carbon nanotube structure to make the temperature of the carbon nanotube structure reach about 2500° C. Acetylene is supplied to the cavity for about 25 minutes, and a flow rate of acetylene is about 20 sccm.

Figure 12:
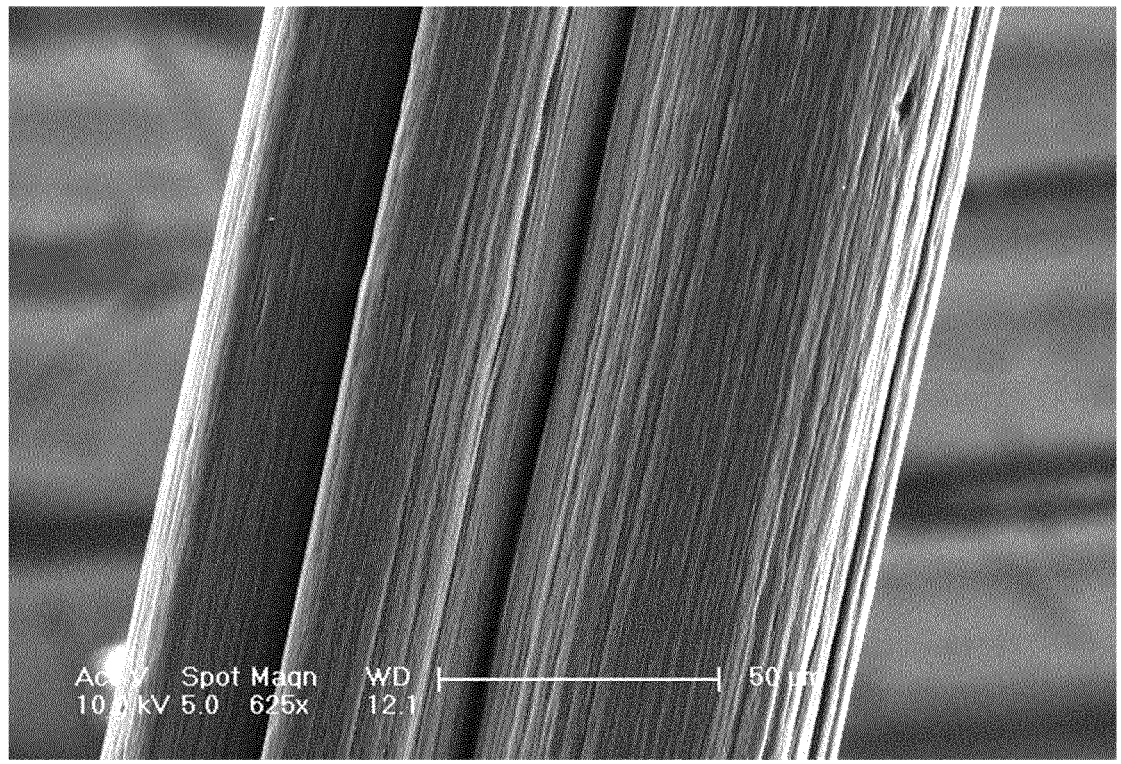
FIG. 12 is an electron microscope image of a carbon nanotube structure of the epitaxial growing device in FIG. 11 after a deposition of a graphite layer.
Figure 13:
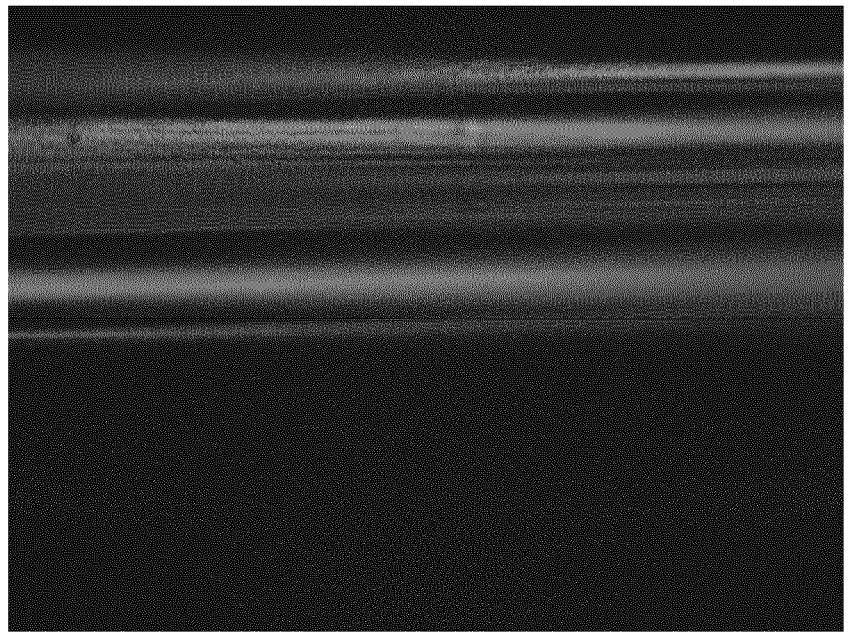
FIG. 13 is an optical microscope image of the carbon nanotube structure in FIG. 12.

FIG. 12 is an electron microscope image of the carbon nanotube structure in Example 2. FIG. 13 is an optical microscope image of the carbon nanotube structure in Example 2. FIG. 12 and FIG. 13 show that a uniform epitaxial graphite layer is formed on the outer surface of the carbon nanotube structure.

Figure 14:
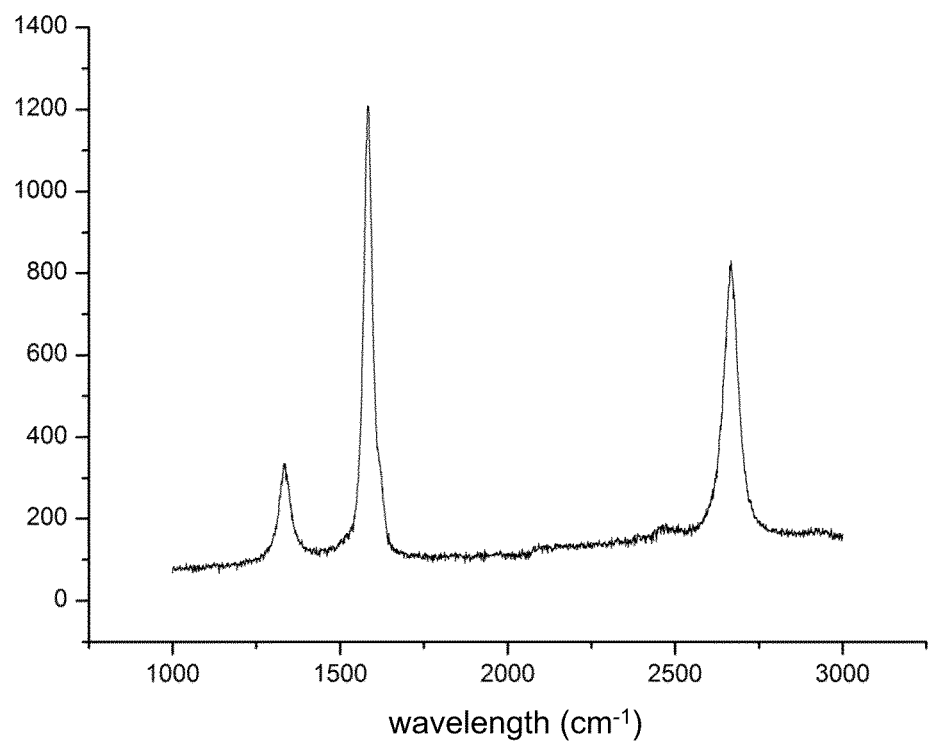
FIG. 14 is a Raman spectrum of the carbon nanotube structure in FIG. 12.

Referring to FIG. 14, a Raman peak at 1340 cm$^{-1}$ of the carbon nanotube structure in Example 2 is small, which shows that amorphous carbon on the outer surface of the carbon nanotube structure is less. FIG. 14 also shows an excellent graphitized carbon layer formed on the outer surface of the carbon nanotube structure.

Figure 15:
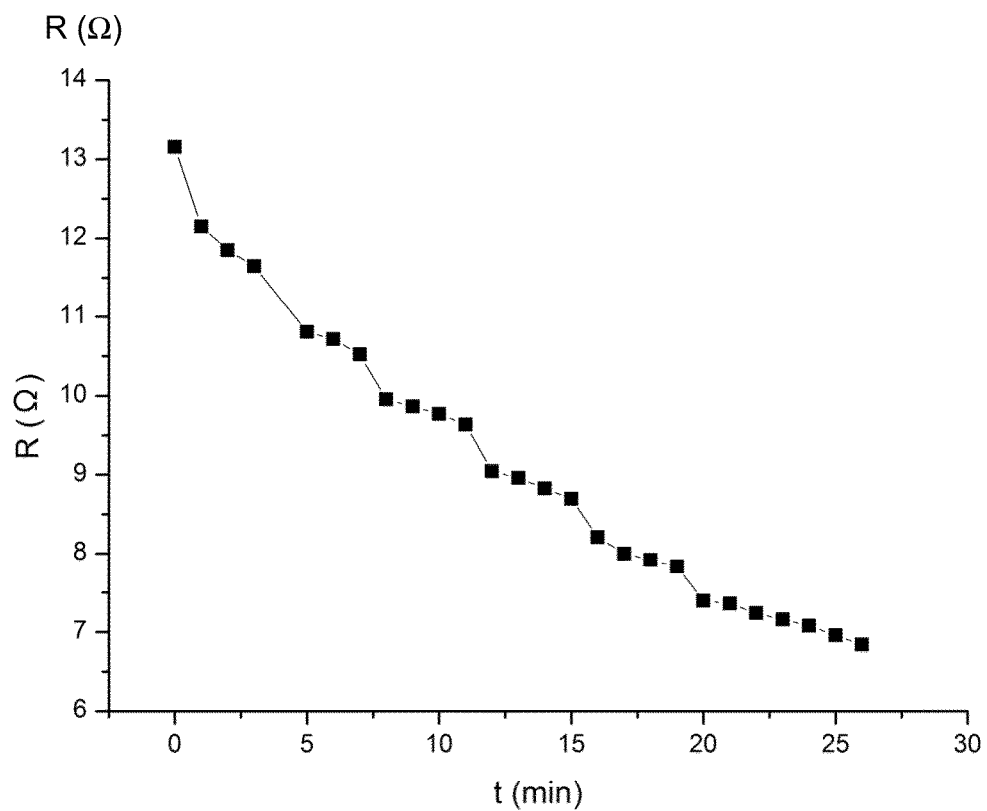
FIG. 15 is a resistance curve over time of the carbon nanotube structure of the epitaxial growing device in FIG. 11 during a deposition of a graphite layer.

Referring to FIG. 15, the resistance of the carbon nanotube structure in Example 2 decreases as the heating time increases, which shows that a diameter of the carbon nanotube structure in Example 2 increases as the heating time increases. A thickness of the graphite layer deposited on the surface of the carbon nanotube structure in Example 2 is also shown to be increased as the heating time increases.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

The above-described embodiments are intended to illustrate rather than to limit the disclosure. Variations may be made to the embodiments without departing from the spirit of the disclosure as claimed. Elements associated with any of the above embodiments are envisioned to be associated with any other embodiments. The above-described embodiments illustrate the scope of the disclosure but do not restrict the scope of the disclosure.

What is claimed is:

1. An epitaxial growing system comprising: a cavity comprising a reaction chamber; a gas supply unit connected to the reaction chamber and configured to supply gas to the reaction chamber; a vacuum pumping unit connected to the reaction chamber and configured to vacuum pumping the reaction chamber; a first electrode and a second electrode located in the reaction chamber; and a carbon nanotube structure located in the reaction chamber and electrically connected to the first electrode and the second electrode, wherein the carbon nanotube structure is suspended through the first electrode and the second electrode, the carbon nanotube structure comprises a first end and a second end, the first end is fixed on the first electrode via a first conductive and heat-resistant cup, and the second end is fixed on the second electrode via a second conductive and heat-resistant clip; a first carbon nanotube film is located between the first conductive and heat-resistant clip and the first electrode, and a second carbon nanotube film is located between the second conductive and heat-resistant clip and the second electrode, the first end of carbon nanotube structure is directly contacted with the first carbon nanotube film and not directly contacted with the first electrode, and the second end of carbon nanotube structure is directly contacted with the second carbon nanotube film and not directly contacted with the second electrode.

2. The epitaxial growing system of claim 1, wherein the carbon nanotube structure comprises at least one carbon nanotube array comprising a plurality of carbon nanotubes, and an extending direction of each of the plurality of carbon nanotubes is perpendicular to a surface of the carbon nanotube structure.

3. The epitaxial growing system of claim 2, wherein the carbon nanotube structure comprises at least two carbon nanotube arrays, and the at least two carbon nanotube arrays are arranged side by side or stacked with each other.

4. The epitaxial growing system of claim 1, wherein the epitaxial growing device further comprises an infrared thermometer, the cavity further comprises a visual window; and the infrared thermometer is configured to measure a temperature of the carbon nanotube structure at the visual window.

5. The epitaxial growing system of claim 1, further comprising a plasma device located between the gas supply unit and the cavity, and the plasma device is configured to render a gas in the gas supply unit into a plasma.

* * * * *